US012768076B2

(12) United States Patent
Ogawa et al.

(10) Patent No.: US 12,768,076 B2
(45) Date of Patent: Oct. 20, 2026

(54) AlN MONOCRYSTAL PLATE INCLUDING A Ga METAL COMPONENT CONTAINING REGION

(71) Applicant: NGK Insulators, Ltd., Nagoya (JP)

(72) Inventors: Hirohisa Ogawa, Kitanagoya (JP); Yoshimasa Kobayashi, Nagoya (JP); Kazuki Iida, Nagoya (JP); Hiroyuki Shibata, Okazaki (JP)

(73) Assignee: NGK INSULATORS, LTD., Nagoya (JP)

( * ) Notice: Subject to any disclaimer, the term of this patent is extended or adjusted under 35 U.S.C. 154(b) by 895 days.

(21) Appl. No.: 17/807,395

(22) Filed: Jun. 17, 2022

(65) Prior Publication Data

US 2022/0328723 A1 Oct. 13, 2022

Related U.S. Application Data

(63) Continuation of application No. PCT/JP2020/046970, filed on Dec. 16, 2020.

(30) Foreign Application Priority Data

Dec. 23, 2019 (JP) ................................ 2019-231908

(51) Int. Cl.
*C30B 29/40* (2006.01)
*C30B 29/38* (2006.01)
(Continued)

(52) U.S. Cl.
CPC ............ *C30B 29/403* (2013.01); *C30B 29/38* (2013.01); *C30B 29/406* (2013.01); *H10H 20/825* (2025.01); *H10P 14/3216* (2026.01)

(58) Field of Classification Search
USPC ........................................................... 257/75
See application file for complete search history.

(56) References Cited

U.S. PATENT DOCUMENTS

2007/0072396 A1* 3/2007 Feltin ................ H01L 21/02439 438/479
2011/0254135 A1* 10/2011 Toba .................. H10P 14/3241 257/E29.089
2017/0077349 A1* 3/2017 Watanabe ............ H10H 20/811

FOREIGN PATENT DOCUMENTS

JP 2007-056349 A 3/2007
JP 2007-506635 A 3/2007
(Continued)

OTHER PUBLICATIONS

Japanese Office Action (with English translation) dated Jul. 30, 2024 (Application No. 2021-567340).
(Continued)

*Primary Examiner* — Eva Y Montalvo
*Assistant Examiner* — Jiyoung Oh
(74) *Attorney, Agent, or Firm* — Muncy, Geissler, Olds & Lowe, P.C.

(57) ABSTRACT

An AlN monocrystal plate disclosed herein may include: a first surface in a thickness direction; and a second surface opposing the first surface. A metal component containing region may be disposed substantially parallel to the first surface in an intermediate portion between the first surface and the second surface. In the metal component containing region, a plurality of metal components may be introduced and distributed. A type of the metal components may be Ga.

8 Claims, 1 Drawing Sheet

(51) Int. Cl.

| | |
|---|---|
| ***H10H 20/825*** | (2025.01) |
| ***H10P 14/20*** | (2026.01) |

(56) References Cited

FOREIGN PATENT DOCUMENTS

| | | | | | |
|---|---|---|---|---|---|
| JP | 2009-018975 | A | | 1/2009 | |
| JP | 2010-171420 | A | | 8/2010 | |
| JP | 2015040136 | A | * | 3/2015 | ............. H01L 21/20 |
| KR | 20150015760 | | * | 2/2015 | |
| WO | WO-2014192911 | A1 | * | 12/2014 | ........... H10H 20/817 |
| WO | WO-2016051890 | A1 | * | 4/2016 | ........... H10H 20/812 |

OTHER PUBLICATIONS

English translation of the Written Opinion of the International Search Authority dated Feb. 16, 2021 (Application No. PCT/JP2020/046970).

Kumagai et al., "*Homo-Epitaxy on Physical Vapor Transport Grown AlN Wafters by Hydride Vapor Phase Epitaxy and Its Application to Fabrication of Deep-UV LEDs*," The Journal of The Japanese Association for Crystal Growth, 2014, vol. 41, No. 3, pp. 131-137.

International Search Report and Written Opinion dated Feb. 16, 2021 (Application No. PCT/JP2020/046970).

Chinese Office Action (with English translation) dated Jan. 2, 2024 (Application No. 202080080357.9).

* cited by examiner

AlN MONOCRYSTAL PLATE INCLUDING A Ga METAL COMPONENT CONTAINING REGION

CROSS REFERENCE

The present application claims priority to Japanese Patent Application No. 2019-231908, filed on Dec. 23, 2019, the entire contents of which are incorporated herein by reference.

TECHNICAL FIELD

The art disclosed herein relates to an aluminum Nitride (AlN) monocrystal plate.

BACKGROUND

An AlN monocrystal plate may be used as a substrate in an ultraviolet light emitting device. For example, Non-Patent Literature 1 describes a method of manufacturing an ultraviolet light emitting device fabricated on an AlN monocrystal plate. In the Non-Patent Literature 1, a function layer of the ultraviolet light emitting device is deposited on the AlN monocrystal plate. After the function layer is deposited on the AlN monocrystal plate, the AlN monocrystal plate is thinned by mechanical polishing to increase ultraviolet light transmittance.

CITATION LIST

Non-Patent Literature

Non-Patent Literature 1: Yoshinao KUMAGAI and 2 others, "Homo-Epitaxy on Physical Vapor Transport Grown AlN Wafers by HVPE and Its Application to Fabrication of Deep-UV LEDs", The Journal of The Japanese Association for Crystal Growth, 2014, Vol. 41, No. 3, p. 131-137

SUMMARY

In the ultraviolet light emitting device described in Non-Patent Literature 1, the AlN monocrystal plate is used as a handling substrate for fabricating the ultraviolet light emitting device. Due to this, the AlN monocrystal plate is thinned to a required thickness by mechanical polishing after the function layer has been deposited on the thick AlN monocrystal plate. However, when the AlN monocrystal plate is thinned by the mechanical polishing, the function layer could be affected by the mechanical polishing. Thus, conventionally, when an AlN monocrystal plate is to be thinned by mechanical polishing, the mechanical polishing has to be performed with significant care to suppress such an adverse effect on a function layer. As a result of this, time required to manufacture an ultraviolet light emitting device increases. As such, an AlN monocrystal plate that can easily be thinned is in demand.

The disclosure herein discloses an AlN monocrystal plate that can easily be thinned.

Solution to Technical Problem

An AlN monocrystal plate disclosed herein comprises a first surface in a thickness direction, and a second surface opposing the first surface. In this AlN monocrystal plate, a metal component containing region is disposed substantially parallel to the first surface in an intermediate portion between the first surface and the second surface.

In the above AlN monocrystal plate, the metal component containing region having a plurality of metal components introduced and distributed therein is disposed in the intermediate portion between the first surface and the second surface. Due to this, the AlN monocrystal plate can be thinned for example by emitting laser onto the AlN monocrystal plate to sublimate (evaporate) the metal components and generate fine cracks in the metal component containing region. That is, the AlN monocrystal plate can be thinned by a method other than mechanical polishing, such as laser liftoff. Due to this, the AlN monocrystal plate can easily be thinned, and an adverse effect imposed on a function layer of an ultraviolet light emitting device upon thinning an AlN monocrystal substrate can be reduced.

DESCRIPTION OF EMBODIMENTS

Figure 1:
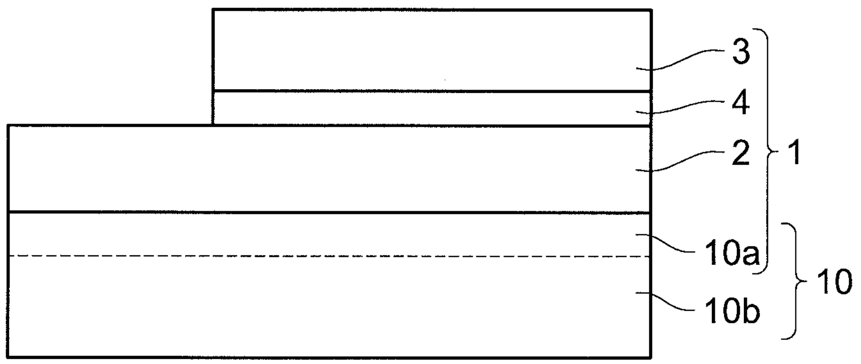
FIG. 1 is a schematic diagram of an ultraviolet light emitting device fabricated using an AlN monocrystal plate of an embodiment.

Some of the features characteristic to below-described embodiments will herein be listed. It should be noted that the respective technical elements are independent of one another, and are useful solely or in combinations. The combinations thereof are not limited to those described in the claims as originally filed.

An AlN monocrystal plate disclosed herein has a close or the same grating constant as a nitride semiconductor such as $Al_xGa_yN$ ($0 \le x \le 1$, $0 < y \le 1$) as compared for example to sapphire. Due to this, the AlN monocrystal plate disclosed herein is useful as a growing substrate for an ultraviolet light emitting device (UV LED) that has a nitride semiconductor as a function layer. Further, the AlN monocrystal plate has a close or the same thermal expansion coefficient as the nitride semiconductor such as $Al_xGa_yN$ ($0 \le x \le 1$, $0 < y \le 1$) as compared for example to sapphire, and exhibits mechanical strength not inferior to that of sapphire. Due to this, it is useful as a handling substrate for fabricating the ultraviolet light emitting device. The AlN monocrystal plate disclosed herein may comprise a metal component containing region disposed in an intermediate portion between a first surface and a second surface in a thickness direction, wherein in the metal component containing region, a plurality of metal components is introduced and distributed. The metal component containing region is substantially parallel to the first surface (or the first and second surfaces). Due to this, after the ultraviolet light emitting device has been fabricated on the AlN monocrystal plate, for example, laser may be emitted onto the AlN monocrystal plate on the opposite side from the surface where the ultraviolet light emitting device was fabricated, the metal components in the metal component containing region may be caused to absorb the laser, and the back surface-side of the AlN monocrystal plate relative to the metal component containing region (being a side where the function layer of the ultraviolet light emitting device is not provided) may be lifted off. Since the AlN monocrystal plate can be thinned within a short period of time regardless of a thickness of the AlN monocrystal plate that is to be lifted off (removed), a time for manufacturing the ultraviolet light emitting device can be shortened. That is, even when the ultraviolet light emitting device is fabricated using a thick AlN monocrystal plate, increase in the time required for manufacturing the ultraviolet light emitting device can be suppressed. Further, thinning of the AlN monocrystal plate using laser liftoff can reduce a force (vibration) applied to the function layer of the ultraviolet light emitting device as compared to thinning using mechanical polishing, and an adverse effect imposed on the function layer can be reduced. The metal component containing region and portions that are not the metal component containing region within the AlN monocrystal plate can be distinguished by observing the AlN monocrystal plate using an SEM or the like. Further, the "first surface" refers to one of front and back surfaces of the AlN monocrystal plate, and the "second surface" refers to the other of the front and back surfaces of the AlN monocrystal plate. For example, the "first surface" may refer to the front surface of the AlN monocrystal plate and the "second surface" may refer to the back surface of the AlN monocrystal plate. Alternatively, the "first surface" may refer to the back surface of the AlN monocrystal plate and the "second surface" may refer to the front surface of the AlN monocrystal plate. Further, the "metal component containing region being disposed substantially parallel to the first surface" refers to a configuration in which the metal component containing region extends along the first surface at an angle that is less than 5 degrees with respect to the first surface. The AlN monocrystal plate disclosed herein may have the thickness (distance between its front and back surfaces) of, although not particularly limited to, 0.3 to 1.0 mm.

In the AlN monocrystal plate disclosed herein, the metal component containing region is arranged locally between the front surface and the back surface. That is, the metal component containing region is arranged only in a part of the AlN monocrystal plate in the thickness direction. For example, a thickness of the metal component containing region in the AlN monocrystal plate may be 0.1 μm or more and 5.0 μm or less. When the thickness of the metal component containing region is 0.1 μm or more, the metal components sufficiently absorb the laser and sublimate upon the laser emittance onto the AlN monocrystal plate, as a result of which fine cracks are generated in the metal component containing region and a part of the AlN monocrystal plate (portion thereof to be removed) can be lifted off. Further, when the thickness is 5.0 μm or less, the cracks generated in the metal component containing region upon the laser emittance onto the AlN monocrystal plate can be suppressed from extending to the portions other than the metal component containing region (it can be easier to allow the cracks to stay within the metal component containing region), thus the laser liftoff can suitably be performed on the AlN monocrystal plate without adverse effects on the ultraviolet light emitting device. The thickness of the metal component containing region may be 0.2 μm or more, may be 0.3 μm or more, may be 0.5 μm or more, may be 0.7 μm or more, may be 1.0 μm or more, or may be 1.5 μm or more. Further, the thickness of the metal component containing region may be 4.5 μm or less, may be 4.0 μm or less, may be 3.0 μm or less, may be 2.0 μm or less, may be 1.0 μm or less, or may be 0.5 μm or less.

In the AlN monocrystal plate disclosed herein, a distance between the metal components adjacent to each other in the metal component containing region may be 1 μm or more and 300 μm or less. In other words, spacing between the metal components may be 1 μm or more and 300 μm or less. When the distance between the adjacent metal components is 1 m or more, the adverse effect on the ultraviolet light emitting device caused by the cracks generated in the metal component containing region can be suppressed. Further, when the distance is 300 μm or less, the cracks generated in the metal component containing region are connected to one another, and the back surface side of the AlN monocrystal plate can surely be separated by the laser lift-off. The "metal components adjacent to each other" refers to the metal components that are adjacent to each other in a direction along (substantially parallel to) the first surface. The distance between the adjacent metal components may be 2 μm or more, may be 5 μm or more, may be 10 μm or more, may be 20 μm or more, or may be 25 μm or more. Further, the distance between the metal components in the metal component containing region may be 275 m or less, may be 250 μm or less, may be 200 μm or less, may be 150 μm or less, or may be 100 μm or less.

In the AlN monocrystal plate disclosed herein, the metal component containing region may contain at least one type of metal components selected from Al, Ga, Cu, Fe, Mo, Ni, Ta and Ti, and may contain the at least one type of the metal components as its primary component. Containing "at least one type of the metal components as its primary component" refers to containing the given one(s) of the metal components by 50 wt % or more in the metal component containing region. These elements have high performances of absorbing light within a predetermined wavelength range, more specifically light in 245 to 1200 nm range, thus the laser light can easily be absorbed therein. Due to this, according to such a configuration, the AlN monocrystal plate can suitably be subjected to the laser liftoff. The metal component(s) in the metal component containing region may for example be elementary metal(s), an alloy containing the above metal component(s), or an oxide, composite oxide, nitride, composite nitride, or composite oxynitride containing the above metal component(s).

In the AlN monocrystal plate disclosed herein, the metal component containing region may contain at least one type of metal components selected from Al, Ga, Cu and Ni. Materials of the metal components as aforementioned can relatively easily be obtained, and in particular have high laser light absorption. Thus, the laser liftoff can suitably be performed.

In the AlN monocrystal plate disclosed herein, the metal components may be in a form of particles. In this case, the metal components (particles containing the metal components) may each have an aspect ratio of 1 or more and 10 or less. In this case, each of the metal components may be disposed such that its long side extends along (substantially parallel to) the first surface (or the first and second surfaces). Specifically, the long sides of the metal components may be arranged at an angle that is less than 20 degrees with respect to the first surface. When the aspect ratio of each of the metal components is 1 or more, areas of their surfaces along the first surface become sufficiently large, by which their laser absorbing efficiency improves. The laser liftoff can thus be performed efficiently, and the cracks generated in the metal component containing region tend to be substantially parallel to the first surface (or the first and second surfaces), thus the adverse effect on the ultraviolet light emitting device can be suppressed. Further, when the aspect ratio is 10 or less, the metal components can easily be introduced into the AlN monocrystal plate. The aspect ratio may be 0.5 or more, may be 1.0 or more, may be 1.5 or more, or may be 2.0 or more. Further, the aspect ratio may be 8 or less, may be 7 or less, may be 5 or less, or may be 3 or less.

EMBODIMENTS

An AlN monocrystal plate 10 according to an embodiment will be described below. The AlN monocrystal plate 10 is used as a handling substrate for fabricating an ultraviolet light emitting device 1. As such, prior to describing the AlN monocrystal plate 10 in detail, the ultraviolet light emitting device 1 that uses the AlN monocrystal plate 10 as its handling substrate will briefly be described.

The ultraviolet light emitting device 1 is an ultraviolet light emitting diode (UV LED), and includes an AlN monocrystal substrate 10*a*, an n-type nitride semiconductor layer 2, a p-type nitride semiconductor layer 3, and a light emitting layer 4. The n-type nitride semiconductor layer 2 is arranged on a front surface of the AlN monocrystal substrate 10*a*. The light emitting layer 4 is arranged on a part (on the right side in FIG. 1) of a front surface of the n-type nitride semiconductor layer 2. As such, the front surface of the n-type nitride semiconductor layer 2 has a portion on which the light emitting layer 4 is arranged, and the remaining portion is exposed. The p-type nitride semiconductor layer 3 is arranged on a front surface of the light emitting layer 4. That is, the light emitting layer 4 is arranged between the n-type nitride semiconductor layer 2 and the p-type nitride semiconductor layer 3. A front surface of the p-type nitride semiconductor layer 3 and the exposed portion of the front surface of the n-type nitride semiconductor layer 2 each have electrode(s) that is (are) not shown. Although omitted from the drawings, in actuality the n-type nitride semiconductor layer 2 may be constituted of multiple layers, the p-type nitride semiconductor layer 3 may be constituted of multiple layers, and the light emitting layer 4 may be constituted of multiple layers. Materials of and the numbers of layers in the layers in the n-type nitride semiconductor layer 2, the layers in the p-type nitride semiconductor layer 3, and the layers in the light emitting layer 4 may suitably be selected according to an application of the ultraviolet light emitting device 1.

In fabricating the ultraviolet light emitting device 1, firstly the n-type nitride semiconductor layer 2 is deposited on a front surface of the AlN monocrystal plate 10 of the present embodiment. Then, the light emitting layer 4 is deposited on the front surface of the deposited n-type nitride semiconductor layer 2, and the p-type nitride semiconductor layer 3 is deposited on the front surface of the deposited light emitting layer 4. After this, parts of the light emitting layer 4 and the p-type nitride semiconductor layer 3 are removed to expose a part of the front surface of the n-type nitride semiconductor layer 2. The AlN monocrystal plate 10 is used to deposit high-quality nitride semiconductor layers 2, 3, 4. Further, the thick AlN monocrystal plate 10 is used as the handling substrate for fabricating the ultraviolet light emitting device 1 so as to facilitate deposition and processing of the n-type nitride semiconductor layer 2, the p-type nitride semiconductor layer 3, and the light emitting layer 4. On the other hand, if the thick AlN monocrystal plate 10 is used as it is as the substrate for the ultraviolet light emitting device 1, emitted light (ultraviolet light) cannot easily be transmitted through the AlN monocrystal plate 10 (AlN monocrystal plate 10*a*) due to the thickness of the AlN monocrystal plate 10. Due to this, after the deposition of the n-type nitride semiconductor layer 2, the p-type nitride semiconductor layer 3, and the light emitting layer 4, the AlN monocrystal plate 10 is thinned to a required thickness. That is, a removable portion 10*b*, which is an unnecessary portion, is removed from the AlN monocrystal plate 10 so that only the AlN monocrystal substrate 1O*a* that is necessary as the substrate remains. Hereinbelow, the n-type nitride semiconductor layer 2, the p-type nitride semiconductor layer 3, and the light emitting layer 4 may collectively be termed a "function layer".

Figure 2:
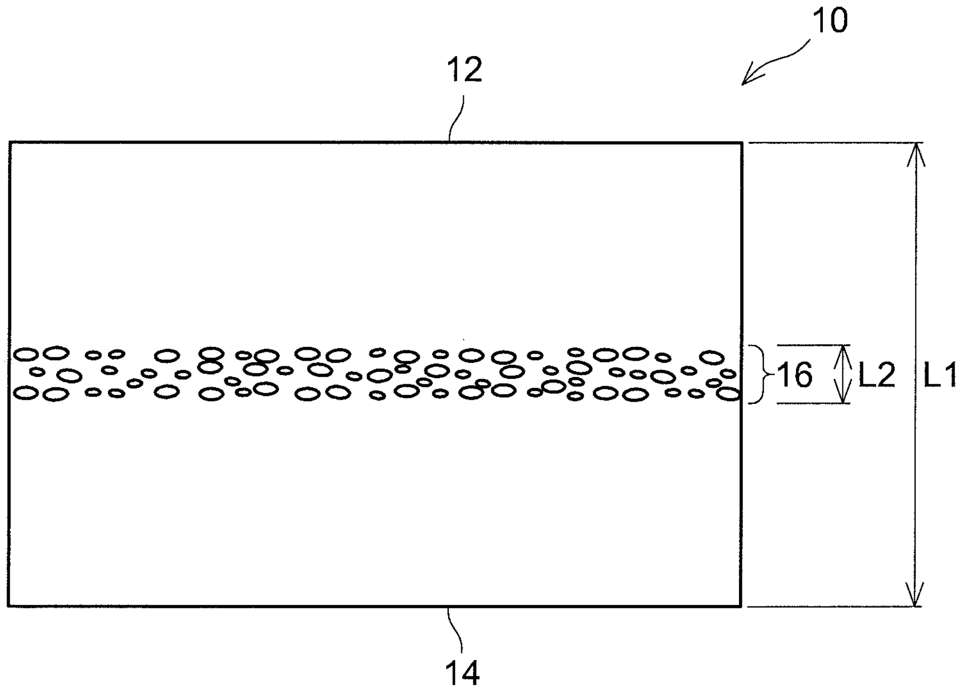
FIG. 2 is a schematic diagram of the AlN monocrystal plate of the embodiment.

As shown in FIG. 2, the AlN monocrystal plate 10 is constituted of monocrystal AlN. The AlN monocrystal plate 10 may be fabricated for example by sublimation. A method for fabricating the AlN monocrystal plate 10 is not particularly limited, and the AlN monocrystal plate 10 may for example be fabricated using other methods, such as a vapor phase deposition method including CVD method, HVPE method, MBE method, and sputtering method, a liquid phase deposition method including hydrothermal method and Na Flux method, and room temperature bonding that bonds two pieces of monocrystal AlN using surface activation method.

Further, the AlN monocrystal plate 10 includes a metal component containing region 16 arranged between a front surface 12 and a back surface 14. In the present embodiment, a surface of the AlN monocrystal plate 10 on which the function layer is deposited in fabricating the ultraviolet light emitting device 1 using the AlN monocrystal plate 10 as the handling substrate is termed the front surface 12, and a surface thereof on the opposite side is termed the back surface 14. The metal component containing region 16 is arranged locally in a thickness direction of the AlN monocrystal plate 10, and is arranged substantially parallel to the front surface 12 and the back surface 14 in an intermediate portion between the front surface 12 and the back surface 14 (intermediate portion in the thickness direction).

In the metal component containing region 16, a plurality of metal particles is introduced and distributed in monocrystal AlN. Specifically, the metal particles in the metal component containing region 16 are each adjusted to have an aspect ratio of 1 or more and 10 or less and are each arranged such that its long side extends along the front surface 12 and the back surface 14. Further, each of the metal particles is arranged with spacing from the others such that a distance between adjacent metal components is from 1 μm to 300 μm. A method for introducing the metal particles (metal components) is not particularly limited. For example, the metal component containing region 16 may be formed by mixing a material containing the metal components to a material (solid material or material gas) that constitutes the AlN monocrystal layer. Alternatively, the metal components may be introduced into the intermediate portion of the AlN monocrystal layer by forming an AlN monocrystal layer, thereafter applying the material containing the metal components to a front surface thereof, and thereafter forming another AlN monocrystal layer on the front surface of the AlN monocrystal layer (on the surface where the material containing the metal components was applied). Further, the metal particles are elemental metal(s) selected from Al, Ga, Cu, Fe, Mo, Ni, Ta, and Ti. The metal component containing region 16 contains at least one type of these metal components as its primary component(s). The metal particles may be an alloy containing the metal element(s), may be an oxide or composite oxide containing the metal element(s), may be a nitride or composite nitride containing the metal element (s), or may be a composite oxynitride containing the metal element(s).

Due to the metal particles being introduced therein, the metal component containing region 16 hinders the laser light to be transmitted from the front surface 12 to the back surface 14 (or from the back surface 14 to the front surface 12) of the AlN monocrystal plate 10. Specifically, when the laser light is emitted from the back surface 14 of the AlN monocrystal plate 10, the metal particles in the metal component containing region 16 absorb the laser light. As a result, the metal components are sublimated (evaporated), and the removable portion 10*b* (see FIG. 1) can thereby be removed (lifted off). The metal particles introduced into the metal component containing region 16 are selected to have high absorption of the laser light. Specifically, the metal particles with high absorption of light with a wavelength of 245 nm to 1200 nm are introduced into the metal component containing region 16.

Examples of metals with high absorption of light with the wavelength of 245 nm to 1200 nm are shown in Table 1 as below. Metals shown in Table 1 (Al, Ga, Cu, Fe, Mo, Ni, Ta, Ti) effectively absorb laser light with the wavelength of 245 nm to 1200 nm. Table 1 shows absorbance of light with the wavelength of 400 nm and 800 nm in those metals. The metals shown in Table 1 (Al, Ga, Cu, Fe, Mo, Ni, Ta, Ti) effectively absorb the light with the wavelength of 245 nm to 1200 nm. Due to this, when laser light with the wavelength of 245 nm to 1200 nm is emitted, the metal particles containing these elements absorb the laser light and evaporate. Since the metal component containing region 16 is arranged substantially parallel to the front surface 12 and the back surface 14 of the AlN monocrystal plate 10, the AlN monocrystal plate 10 is separated at the metal component containing region 16. Thus, the AlN monocrystal plate 10 in which the metal particles containing at least one type of these elements are introduced can be thinned along the metal component containing region 16 using the laser liftoff.

TABLE 1

| | Absorbance | |
|---|---|---|
| | 400 nm | 800 nm |
| Al | 4.87 | 8.45 |
| Ga | 4.50 | 8.50 |
| Cu | 2.14 | 5.26 |
| Fe | 3.04 | 3.69 |
| Mo | 3.21 | 3.36 |
| Ni | 2.36 | 4.39 |
| Ta | 2.28 | 3.53 |
| Ti | 3.39 | 0.89 |

In the present embodiment, for example, a thickness L1 of the AlN monocrystal plate 10 is adjusted to be within 0.3 mm to 1.0 mm, and a thickness L2 of the metal component containing region 16 is adjusted to be within 0.1 μm to 5.0 μm. The thickness L1 of the AlN monocrystal plate 10 is a length between the front surface 12 and the back surface 14, and indicates a length in a direction vertical to the front surface 12 and the back surface 14. Further, the thickness L2 of the metal component containing region 16 also indicates a length in the direction vertical to the front surface 12 and the back surface 14. By setting the thickness L2 of the metal component containing region 16 to be 0.1 μm or more, the metal particles (metal components) can be ensured to absorb the laser light, and an effect of generating heat in the metal component containing region 16 can thereby be achieved. As a result of this, the laser liftoff can be performed in the metal component containing region 16. Further, by setting the thickness L2 to be 5.0 μm or less, the crack generation caused by the laser light emission can be contained within the metal component containing region 16. Due to this, an adverse effect on the ultraviolet light emitting device can be suppressed.

Specific examples of the disclosure herein have been described in detail, however, these are mere exemplary indications and thus do not limit the scope of the claims. The art described in the claims includes modifications and variations of the specific examples presented above. Technical features described in the description and the drawings may technically be useful alone or in various combinations, and are not limited to the combinations as originally claimed.

The invention claimed is:

1. An aluminum nitride (AlN) monocrystal plate comprising:

a first surface in a thickness direction; and a second surface opposing the first surface, wherein a metal component containing region is disposed substantially parallel to the first surface in an intermediate portion between the first surface and the second surface, wherein in the metal component containing region, a plurality of metal components is introduced and distributed, and wherein Ga is contained in an amount of 50 wt % or more among the plurality of metal components in the metal component containing region.

2. The AlN monocrystal plate according to claim 1, wherein a thickness of the metal component containing region is 0.1 μm or more and 5.0 μm or less.

3. The AlN monocrystal plate according to claim 1, wherein in the metal component containing region, a distance between the metal components adjacent to each other is 1 μm or more and 300 μm or less.

4. The AlN monocrystal plate according to claim 1, wherein each of the plurality of metal components has an aspect ratio of 1 or more and 10 or less, and is disposed such that its long side extends along the first surface.

5. The AlN monocrystal plate according to claim 2, wherein in the metal component containing region, a distance between the metal components adjacent to each other is 1 μm or more and 300 μm or less.

6. The AlN monocrystal plate according to claim 2, wherein each of the plurality of metal components has an aspect ratio of 1 or more and 10 or less, and is disposed such that its long side extends along the first surface.

7. The AlN monocrystal plate according to claim 3, wherein each of the plurality of metal components has an aspect ratio of 1 or more and 10 or less, and is disposed such that its long side extends along the first surface.

8. The AlN monocrystal plate according to claim 5, wherein each of the plurality of metal components has an aspect ratio of 1 or more and 10 or less, and is disposed such that its long side extends along the first surface.

* * * * *